United States Patent
Yeh et al.

(10) Patent No.: US 8,141,512 B2
(45) Date of Patent: Mar. 27, 2012

(54) PLATING APPARATUS

(75) Inventors: Tso-Hung Yeh, Taoyuan (TW); Hung-Yi Chang, Taoyuan (TW); Chih-Lung Hsiao, Taoyuan (TW)

(73) Assignee: Zhen Ding Technology Co., Ltd., Tayuan, Taoyuan (TW)

( * ) Notice: Subject to any disclaimer, the term of this patent is extended or adjusted under 35 U.S.C. 154(b) by 1123 days.

(21) Appl. No.: 11/967,005

(22) Filed: Dec. 29, 2007

(65) Prior Publication Data
US 2009/0013929 A1    Jan. 15, 2009

(30) Foreign Application Priority Data
Jul. 13, 2007  (CN) .......................... 2007 1 0076040

(51) Int. Cl.
*B05C 3/00* (2006.01)
*B05C 11/11* (2006.01)
*B05D 5/12* (2006.01)

(52) U.S. Cl. ..................... 118/406; 118/504; 427/98.4

(58) Field of Classification Search .................. 118/406, 118/504; 205/129, 121; 204/198; 427/98.4
See application file for complete search history.

(56) References Cited

U.S. PATENT DOCUMENTS

| 4,367,125 A * | 1/1983 | Avellone ......................... 205/96 |
| 4,426,266 A * | 1/1984 | Ukena et al. ................... 204/206 |
| 6,217,736 B1 | 4/2001 | Kopp et al. |
| 2001/0054556 A1* | 12/2001 | Nakamoto et al. .............. 205/96 |
| 2004/0245111 A1* | 12/2004 | Fujimoto ....................... 205/129 |

FOREIGN PATENT DOCUMENTS

| CN | 1847465 A | 10/2006 |
| JP | 2002-155395 A | 5/2002 |
| JP | 2002155395 A * | 5/2002 |

* cited by examiner

*Primary Examiner* — Dah-Wei Yuan
*Assistant Examiner* — Charles Capozzi
(74) *Attorney, Agent, or Firm* — Altis Law Group, Inc.

(57) ABSTRACT

A plating apparatus for plating a FPCB base board having a first conveyance region and a second conveyance region includes a shielding apparatus. The shielding apparatus includes a first shielding plate and a second shielding plate. The first shielding plate corresponds to the first conveyance region. A distance between the first shielding plate and the first conveyance region is from 5 millimeters to 20 millimeters. A width of the first shielding is equal to or larger than a width of the first conveyance region. The second shielding plate corresponds to the second conveyance region. A distance between the second shielding plate and the second conveyance region is from 5 millimeters to 20 millimeters. A width of the second shielding is equal to or larger than a width of the second conveyance region. The first and second shielding plates are made of an insulation material.

6 Claims, 6 Drawing Sheets

PLATING APPARATUS

BACKGROUND OF THE INVENTION

1. Field of the Invention

The present invention relates to plating apparatuses and, particularly, to an apparatus for plating flexible printed circuit boards.

2. Description of Related Art

In recent years, flexible printed circuit boards (FPCBs) are widely used in portable electronic devices such as mobile phones, digital cameras and personal digital assists (PDA). In these electronic products, some parts may move relative to a main body. In such environment, FPCB can provide an electrical connection between the main body and the movable parts due to its excellent flexibility.

Nowadays, roll-to-roll process is employed for mass-producing FPCBs. In order to implement roll-to-roll process, a large sheet of raw material can be divided into a number of tape-shaped substrates. Sizes of tape-shaped substrates can be predetermined according to the sizes of the desired FPCBs. FIG. 6 shows a typical tape-shaped substrate 10. The tape-shaped substrate 10 includes a main region 14 for forming FPCB units 15, and two conveying regions 11. The main region 14 is disposed along a lengthwise direction of the tape-shaped substrate 10. Two conveying regions 11 are separately arranged at two sides of the main region 14. Each conveying region 11 includes a number of sprocket holes 12 and a continuous copper layer 13 surrounding the sprocket holes 12. The sprocket holes 12 are disposed along the lengthwise direction of conveying region 11.

In a roll-to-roll process, the sprocket holes 12 are used to mate with rollers to convey the tape-shaped substrate 10. The continuous copper layer 13 is provided to maintain the shape of each of the sprocket holes 12, so as to avoid deformations of the sprocket holes 12 during the conveying process. Regarding the tape-shaped substrate 10, the conveying region 11 is located outside of the main region 14. After the FPCB units 15 have been molded, the conveying region 11 is subject to be thrown away. However, during an electro-plating process, gold/nickel will be plated on the continuous copper layer 13. Thus, these valuable materials (e.g., gold/nickel) will be wasted when the conveying region 11 is thrown away.

Therefore, a plating apparatus is desired to overcome the above shortcomings.

SUMMARY OF THE INVENTION

An embodiment of a plating apparatus for plating a FPCB base board having a first conveyance region and a second conveyance region includes a plating bath and a shielding apparatus. The shielding apparatus includes a first shielding plate and a second shielding plate. The first shielding plate is configured for corresponding to the first conveyance region. A distance between the first shielding plate and the first conveyance region is in a range from 5 millimeters to 20 millimeters. A width of the first shielding plate is equal to or larger than a width of the first conveyance region. The second shielding plate is configured for corresponding to the second conveyance region. A distance between the second shielding plate and the second conveyance region is in a range from 5 millimeters to 20 millimeters. A width of the second shielding plate is equal to or larger than a width of the second conveyance region. The first shielding plate and the second shielding plate are made of an insulation material.

Advantages and novel features will become more apparent from the following detailed description when taken in conjunction with the accompanying drawings.

BRIEF DESCRIPTION OF THE DRAWINGS

Many aspects of the present plating apparatus can be better understood with reference to the following drawings. The components in the drawings are not necessarily drawn to scale, the emphasis instead being placed upon clearly illustrating the principles of the present apparatus. Moreover, in the drawings, like reference numerals designate corresponding parts throughout the several views.

DETAILED DESCRIPTION OF THE INVENTION

Embodiments will now be described in detail below and with reference to the drawings.

Figure 1:
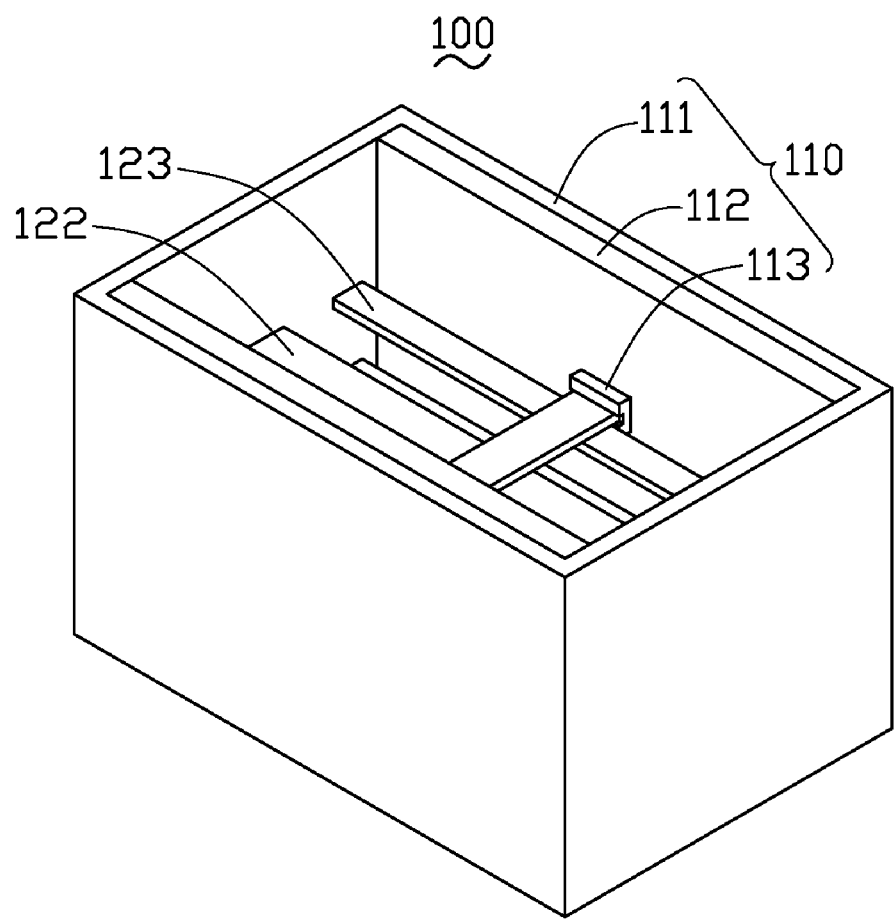
FIG. 1 is an isometric, schematic view of a plating apparatus, in accordance with a present first embodiment.
Figure 2:
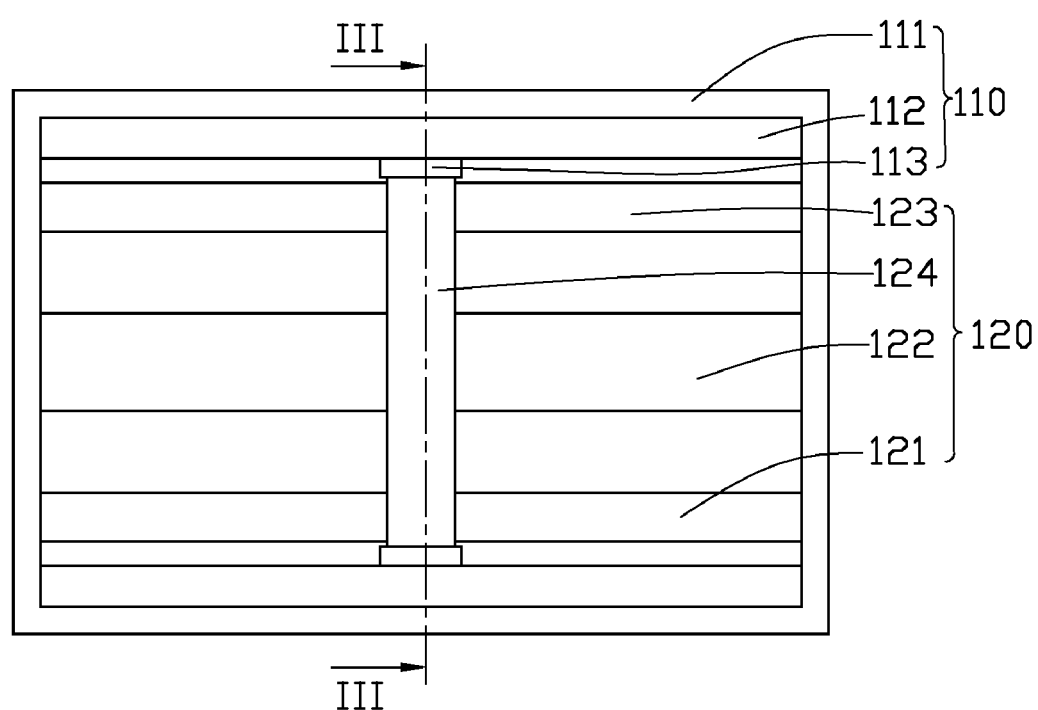
FIG. 2 is a schematic top view of the plating apparatus of FIG. 1.
Figure 3:
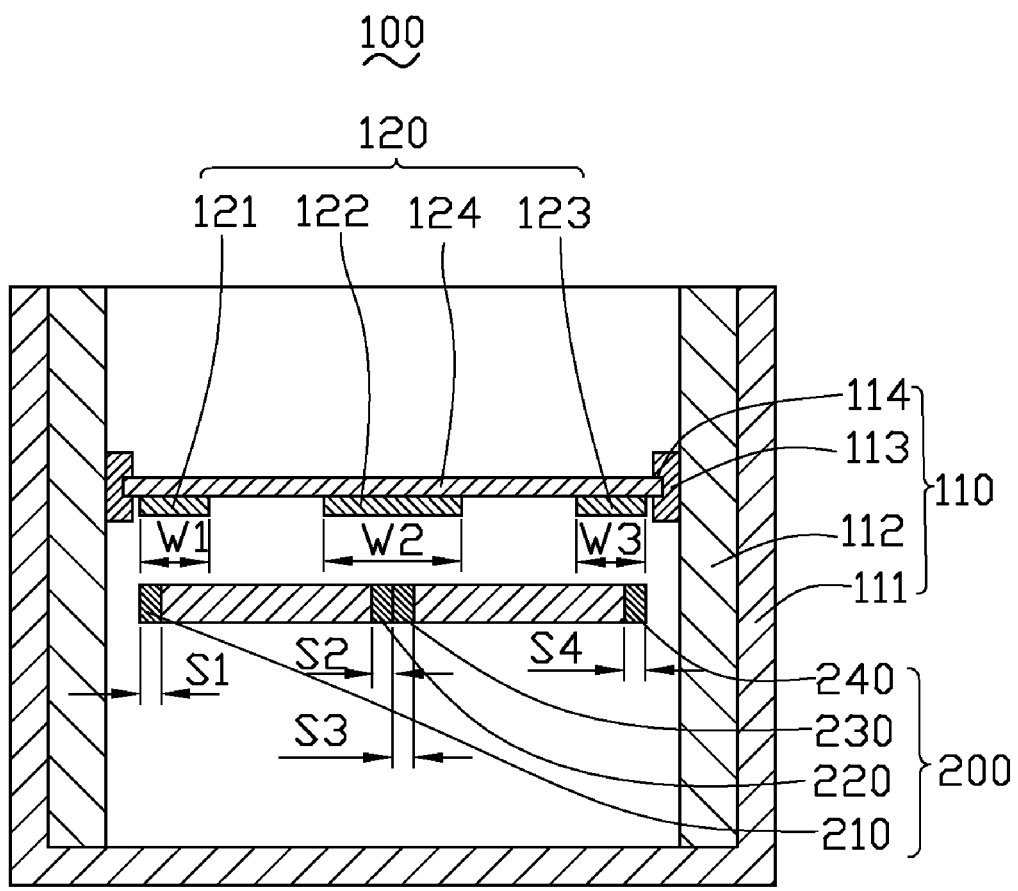
FIG. 3 is a schematic sectional view along line III-III of FIG. 2.

Referring to FIGS. 1 to 3, a plating apparatus 100 for electro-plating flexible printed circuit boards, in accordance with a first embodiment, is shown. The plating apparatus 100 is used to electro-plate gold or other materials on a FPCB (flexible printed circuit board) base board 200. The FPCB base board 200 to be electro-plated has desired via holes, traces, and other necessary configurations formed thereon. In the present embodiment, the plating apparatus 100 is prepared to make a gold finger on the flexible printed circuit board 200. The FPCB base board 200 to be processed can be a single-sided board or a double-sided board. In the present embodiment, the FPCB base board 200 is a single-sided tape-shaped board, and is processed by roll-to-roll technology. The FPCB base board 200 defines two FPCB units in a width direction thereof. In detail, the FPCB base board 200 includes a first conveyance region 210, a second conveyance region 220, a third conveyance region 230 and a fourth conveyance region 240 arranged along a width direction of the FPCB base board 200 in the order written. The first and fourth conveyance regions 210 and 240 are defined at peripheral portions of the FPCB base board 200. The second and third conveyance regions 220 and 230 are defined at a central portion of the FPCB base board 200. The first and second conveyance regions 210 and 220 cooperate to define a region of one FPCB unit along a width direction of the FPCB base board 200. The third and fourth conveyance regions 230 and 240 cooperate to define another region of one FPCB unit along a width direction of the FPCB base board 200.

The plating apparatus 100 includes a plating bath 110 and a shielding apparatus 120. The plating bath 110 includes a tank 111 and an anode 112 disposed on an inner wall of the tank 111. Both of the tank 111 and the anode 112 extend along a lengthwise direction of the FPCB base board 200. The anode 112 can be made of graphite, soluble plating metal such as nickel, gold and etc., or insoluble plating metal such as iridium oxide, titanium-platinum alloy. In the illustrated embodiment as shown in FIGS. 1 to 3, the plating bath 110 includes two anodes 112 oppositely arranged in the tank 111. The shielding apparatus 120 is configured for controlling/limiting a thickness of plating metal formed on surface of the first, second, third, and fourth conveyance regions 210, 220, 230 and 240, to lower the waste of the plating materials. Therefore, the shielding apparatus 120 is made of an insulation material. The purpose of the controlling/limiting function of the shielding apparatus 120 is that the shielding apparatus 120 can be located at a position over the surfaces of the first, second, third, and fourth conveyance regions 210, 220, 230 and 240, and a distance between the shielding apparatus 120 and the surfaces of the first, second, third, and fourth conveyance regions 210, 220, 230 and 240 can be controlled/limited in a desired range. Thus, in an electro-plating process, the plating materials deposited (i.e., plated) on the surfaces of first, second, third, and fourth conveyance regions 210, 220, 230 and 240 extend from these surfaces and terminate at the shielding apparatus 120. As such, the thickness of the plating material is controlled/limited in the desired range.

The shielding apparatus 120 includes a first shielding plate 121, a second shielding plate 122 and a third shielding plate 123. The first shielding plate 121 is configured for limiting a thickness of the plating material formed on the first conveyance region 210. The second shielding plate 122 is configured for limiting a thickness of the plating material formed on the adjacent second and third conveyance regions 220 and 230. The third shielding plate 123 is configured for limiting a thickness of the plating material formed on the fourth conveyance region 240. Each of the first, second and third shielding plates 121, 122 and 123 spatially corresponds to (i.e., is disposed over and parallel to) the surface to be plated of the FPCB base board 200. A distance between each of the three shielding plates 121, 122 and 123 and the corresponding surface to be plated of the FPCB base board 200 is equal to each other, and is in a range from about 5 millimeters to about 20 millimeters. In the present embodiment, the distance is 10 millimeters. In order to avoid the plating material formed on the shielding apparatus 120, the material for making the shielding apparatus 120, especially making the three shielding plates 121, 122 and 123, is insulation material. The insulation material can be polyimide (PI), polyvinyl chloride (PVC), or polypropylene (PP). The three shielding plates 121, 122 and 123 can be made of similar or dissimilar insulation materials.

Advantageously, the shielding apparatus 120 includes a supporting pole 124 for transversely connecting the three shielding plates 121, 122 and 123. Usefully, the supporting pole 124 is made of insulation material. The supporting pole 124 can have a similar or dissimilar material with the above mentioned three shielding plates 121, 122 and 123. The supporting pole 124 can be connected with the three shielding plates 121, 122 and 123 using mechanical manner such as bolting, adhering, or injection molding. In the present embodiment, the supporting pole 124, and the three shielding plates 121, 122, 123 are machined into an integrated structure (i.e., the shielding apparatus 120) by injection molding method.

The first shielding plate 121 is positioned spatially corresponding to the first conveyance region 210 and is arranged parallel to the surface to be plated of the FPCB base board 200. A width (W1) of the first shielding plate 121 is equal to or larger than a width (S1) of the first conveyance region 210, i.e., $W1 \geq S1$. The width of the first shielding plate 121 is in a range from 5 millimeters to 20 millimeters. In the present embodiment, the width of the first shielding plate 121 is about 5 millimeters.

Similarly, the second shielding plate 122 is positioned spatially corresponding to the adjacent second and third conveyance regions 220 and 230 and is arranged parallel to the surface to be plated of the FPCB base board 200. A width (W2) of the second shielding plate 122 is equal to or larger than a sum of a width (S2) of the second conveyance region 220 and a width (S3) of the third conveyance region 230, i.e., $W2 > (S2+S3)$. The width of the second shielding plate 122 is in a range from 10 millimeters to 40 millimeters. In the present embodiment, the width of the second shielding plate 122 is about 10 millimeters.

Similarly, the third shielding plate 123 is positioned spatially corresponding to the fourth conveyance region 240 and is arranged parallel to the surface to be plated of the FPCB base board 200. A width (W3) of the third shielding plate 123 is equal to or larger than a width (S4) of the fourth conveyance region 240, i.e., $W3 \geq S4$. The width of the third shielding plate 123 is in a range from 5 millimeters to 20 millimeters. In the present embodiment, the width of the third shielding plate 123 is about 5 millimeters.

In order to save room, a sum of the width of the first, second and third shielding plates 121, 122 and 123 is not larger than (i.e., equal to or less than) the width of FPCB base board 200.

In the electro-plating process, the FPCB base board 200 is arranged inside the tank 111 of the plating bath 110 along a lengthwise direction of the tank 111. The shielding apparatus 120 can be located inside or outside the tank 111 of the plating bath 110. In the present embodiment, two holding components 113 are separately arranged on two opposite inner walls of the tank 111 for fixing the supporting pole 124. Each of the two holding components 113 defines a groove 114 for receiving the edge of the supporting pole 124 therein. Thus, the two holding components 113 cooperate to support the shielding apparatus 120 by engaging the supporting pole 124. The holding components 113 are made of an insulation material such as PI, PVC, or PP.

With respect to the FPCB base board 200 to be plated by the plating apparatus 100 of the present embodiment, the distance between the shielding plate and the corresponding conveyance region can be determined according to the acceptable thickness of the plating metal to be wasted. Therefore, in the plating apparatus 100, the shielding plates are arranged opposite to their corresponding conveyance regions of the FPCB base board 200 to be plated, thus, the thickness of the plating metal (e.g., gold) formed on the conveyance regions can be limited due to the limited distance between the shielding plates and their corresponding conveyance regions. For example, the distance between the first conveyance region 210 and the first shielding plate 121 is limited in a range from about 5 millimeters to about 20 millimeters, thus, the thickness of the plating metal formed on the first conveyance 210 is limited in a range from about 5 millimeters to about 20 millimeters. The plating metal with such thickness formed on the conveyance region is acceptable, that is, a quantity of the plating metal with such thickness is in an allowable range. Therefore, in the present embodiment, a quantity of the waste plating metal is limited by controlling the distance between the shielding apparatus 120 and the surface of the FPCB base board 200.

Figure 4:
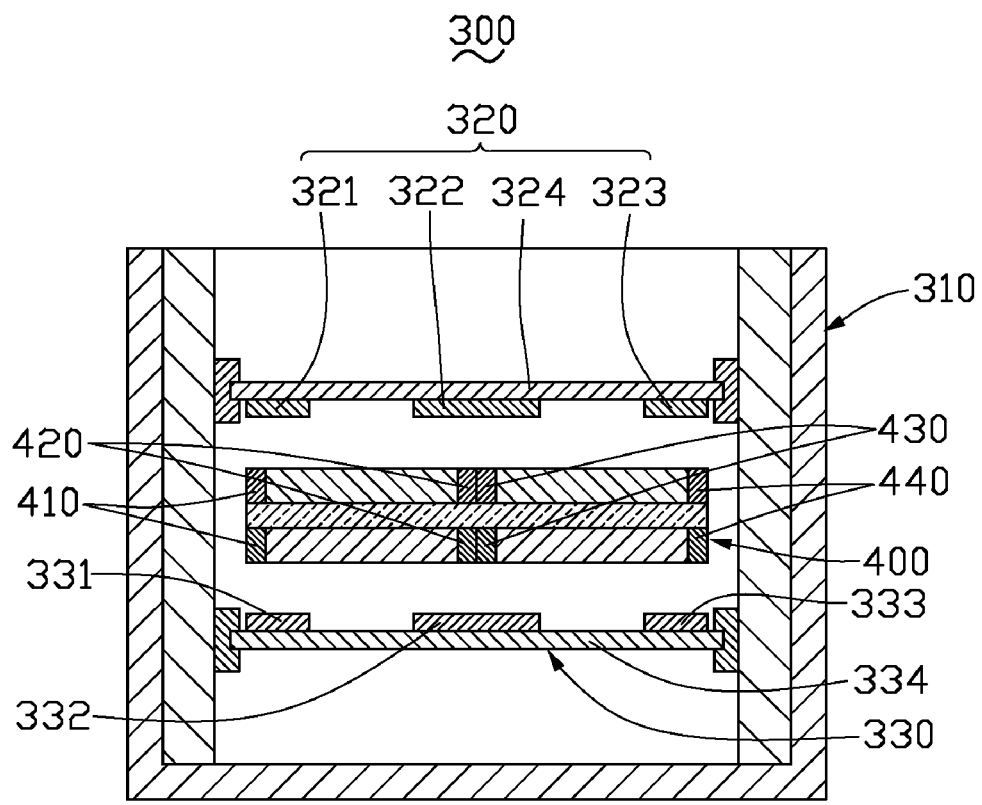
FIG. 4 is a schematic sectional view of a plating apparatus, in accordance with a present second embodiment.

Referring to FIG. 4, a plating apparatus 300 for electro-plating a double-sided FPCB base board 400, in accordance with a second embodiment, is shown. The double-sided FPCB base board 400 includes two opposite first conveyance regions 410, two opposite second conveyance regions 420, two opposite third conveyance regions 430, and two opposite fourth conveyance regions 440. In each surface to be plated of the double-sided FPCB base board 400, the first and second conveyance regions 410 and 420 cooperate to define a region of one FPCB unit along a width direction of the FPCB base board 400, and the third and fourth conveyance regions 430 and 440 cooperate to define another region of one FPCB unit along a width direction of the FPCB base board 400.

The plating apparatus 300 includes a plating bath 310, a first shielding apparatus 320 above the board 400, and a second shielding apparatus 330 below the board 400. The plating bath 310 is similar to the plating bath 110 of the first embodiment. Structure and material of the first and second shielding apparatuses 320 and 330 are similar with those of the shielding apparatus 120 of the first embodiment. The first shielding apparatus 320 includes a first shielding plate 321, a second shielding plate 322, a third shielding plate 323, and a first supporting pole 324 connecting the above three shielding plates 321, 322, 323. The second shielding apparatus 330 includes a fourth shielding plate 331, a fifth shielding plate 332, a sixth shielding plate 333, and a second supporting pole 334 connecting the above three shielding plates 331, 332, 333.

The first shielding apparatus 320 and the second shielding apparatus 330 are separately arranged on two sides of the FPCB base board 400, and each of the six shielding plates 321, 322, 323, 331, 332, 333 is parallel to the two surfaces to be plated of the FPCB base board 400. A distance between each of the six shielding plates 321, 322, 323, 331, 332, 333 and the corresponding surface to be plated of the FPCB base board 400 is in a range from about 5 millimeters to about 25 millimeters.

With respect to the first shielding apparatus 320 and the second shielding apparatus 330, a width of the first shielding plate 321 is equal to that of the fourth shielding plate 331, and the width is in a range from about 5 millimeters to about 25 millimeters. A width of the second shielding plate 322 is equal to that of the fifth shielding plate 332, and the width is in a range from about 10 millimeters to about 40 millimeters. A width of the third shielding plate 323 is equal to that of the sixth shielding plate 333, and the width is in a range from about 5 millimeters to about 20 millimeters. In the present embodiment, the width of the first and fourth shielding plates 321, 331 is 5 millimeters, the width of the second and fifth shielding plates 322, 332 is 10 millimeters, and the width of the third and sixth shielding plates 323, 333 is 5 millimeters.

The first supporting pole 324 and the second supporting pole 334 can have a similar or dissimilar configuration with each other. The first shielding apparatus 320 and the second shielding apparatus 330 are fixed in the plating bath 310 similar to the shielding apparatus 120 of the first embodiment. In addition, the first shielding apparatus 320 and the second shielding apparatus 330 can be connected with each other using a mechanical means such as nuts and bolts or with adhesive.

Figure 5:
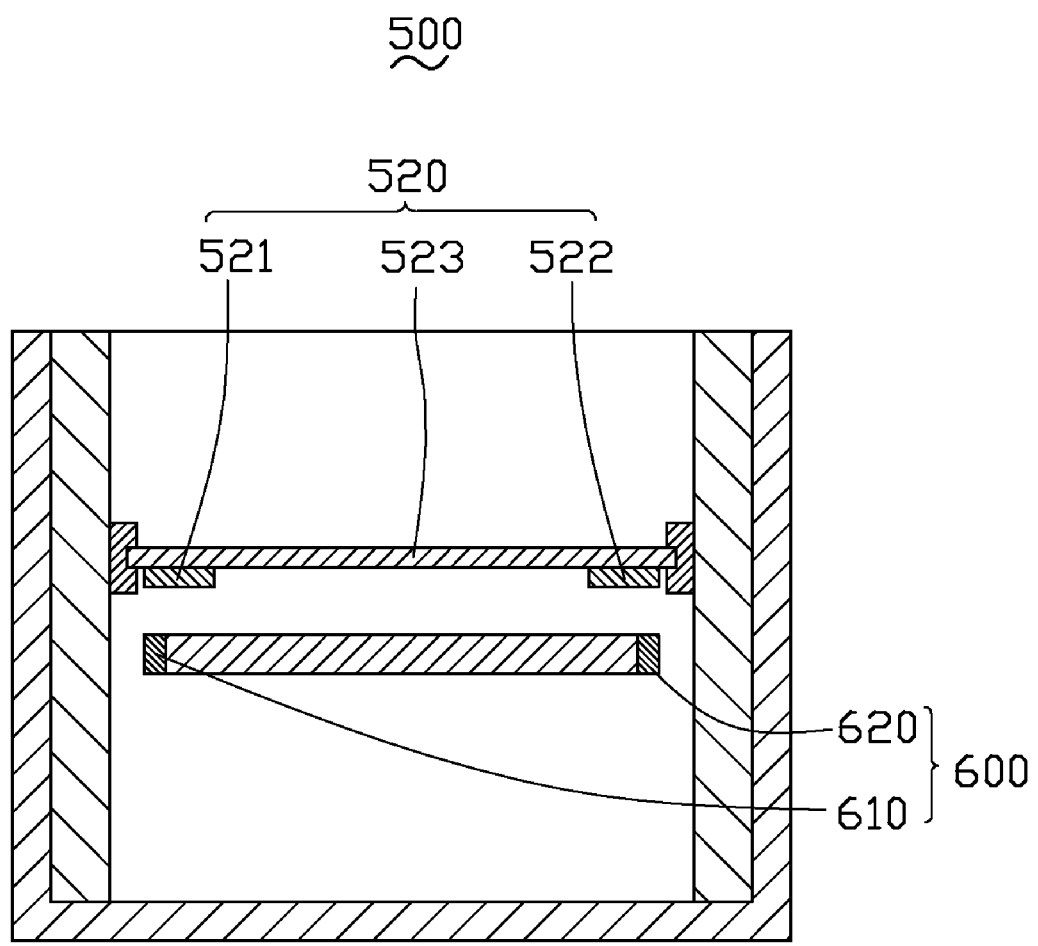
FIG. 5 is a schematic sectional view of a plating apparatus, in accordance with a present third embodiment.
Figure 6:
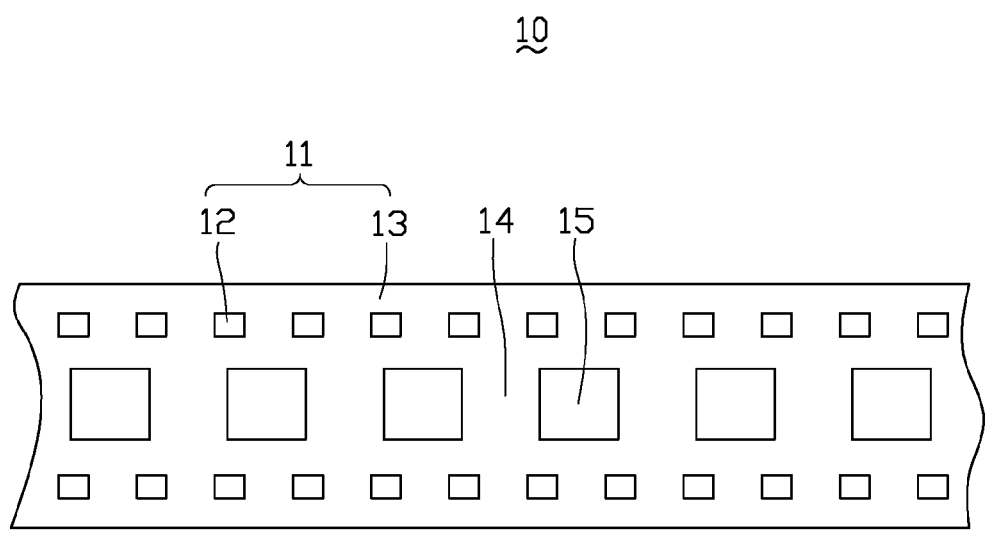
FIG. 6 is a schematic view of a flexible base, in accordance with a related art.

Referring to FIG. 5, a plating apparatus 500 for electroplating a single-sided FPCB base board 600, in accordance with a third embodiment, is shown. The single-sided FPCB base board 600 defines a FPCB unit along a width direction thereof. The single-sided FPCB base board 600 includes a first conveyance region 610 and a second conveyance region 620 that are respectively adjacent to two opposite sides of the board 600, and the two conveyance regions 610, 620 cooperate to define a region of one FPCB unit along the width direction of the FPCB base board 600. The plating apparatus 500 has a similar structure to the plating apparatus 100 except for the shielding apparatus 520. The shielding apparatus 520 includes a first shielding plate 521, a second shielding plate 522, and a supporting pole 523 connecting the first and second shielding plates 521, 522. The shielding apparatus 520 can be made of an insulation material such as PI, PVC, or PP. The supporting pole 523, the first shielding plate 521 and the second shielding plate 522 are formed and machined into an integrated structure, i.e., the shielding apparatus 520.

The first shielding plate 521 and the second shielding plate 522 are parallel to the surface to be plated to be plated of the FPCB base board 600. A distance between each of the first and second shielding plates 521, 522 and the surface of the FPCB base board 600 is about 5 millimeters. The first shielding plate 521 corresponds to the first conveyance region 610, and a width of the first shielding plate 521 is identical with or larger than that of the first conveyance region 610. The second shielding plate 522 corresponds to the second conveyance region 620, and a width of the second shielding plate 522 is identical with or larger than that of the second conveyance region 620. In the present embodiment, the width of the first and second shielding plate 521, 522 is about 5 millimeters.

It is to be understood that structures and sizes of the shielding apparatus can be predetermined according to the structures and sizes of the FPCB base board to be plated. Especially, a surface of the shielding plate adjacent to the surface of the conveyance region can have any configuration, so long as the distance between the shielding plate and the corresponding conveyance region is retained in an allowable range.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A plating apparatus for plating a double-sided flexible printed circuit board (FPCB) base board having two opposite first conveyance regions, two opposite second conveyance regions, two opposite third conveyance regions, and two opposite fourth conveyance regions adjacent to the third conveyance regions, the third and fourth conveyance regions each are positioned between the first and second conveyance regions, the first and third conveyance regions cooperate to define a region of one FPCB unit along a width direction of the double-sided FPCB base board, the second and fourth conveyance regions cooperate to define another region of one FPCB unit along a width direction of the double-sided FPCB base board, the plating apparatus comprising:

a plating bath comprising a tank extending along a lengthwise direction of the FPCB base board;

a first shielding apparatus comprising a first shielding plate and a second shielding plate; and a second shielding apparatus comprising a third shielding plate and a fourth shielding plate; wherein the first and second shielding plates are positioned above the FPCB base board, the third and fourth shielding plates are positioned below the FPCB base board, the first and third shielding plates are parallel to and corresponding to the two opposite first conveyance regions, a distance between each of the first and third shielding plates and the corresponding first conveyance region is in a range from 5 millimeters to 20 millimeters, a width of each of the first and third shielding plates is equal to or larger than a width of the corresponding first conveyance region; the second and fourth shielding plates are parallel to and corresponding to the two opposite second conveyance regions, a distance between each of the second and fourth shielding plates and the corresponding second conveyance region is in a range from 5 millimeters to 20 millimeters, a width of each of the second and fourth shielding plates is equal to or larger than a width of the corresponding second conveyance region; the first, second, third and fourth shielding plates are comprised of an insulation material;

the first shielding apparatus further comprises a fifth shielding plate that corresponds to the adjacent third and fourth conveyance regions on one side of the double-sided FPCB base board, the second shielding apparatus further comprises a sixth shielding plate that corresponds to the adjacent third and fourth conveyance regions on another side of the double-sided FPCB base board, a distance between each of the fifth and sixth shielding plates and the corresponding adjacent third and fourth conveyance regions is in a range from 5 millimeters to 20 millimeters, a width of each of the fifth and sixth shielding plates is equal to or larger than a sum of the width of one third conveyance region and one fourth conveyance region, and the fifth and sixth shielding plate are made of an insulation material;

wherein the fifth shielding plate is parallel to and positioned above the FPCB base board, the sixth shielding plate is parallel to and positioned below the FPCB base board.

2. The plating apparatus as claimed in claim 1, wherein both of the first and second shielding apparatuses are positioned in the tank.

3. The plating apparatus as claimed in claim 1, wherein both of the first and second shielding apparatuses are positioned in the tank.

4. The plating apparatus as claimed in claim 3, wherein the plating bath further comprises an anode disposed on an inner wall of the tank, and the anode extends along a lengthwise direction of the tank.

5. The plating apparatus as claimed in claim 4, wherein the first, second, third, and fourth shielding plates each extend along a lengthwise direction of the FPCB base board.

6. The plating apparatus as claimed in claim 5, wherein the first shielding apparatus further comprises a first insulation supporting pole connecting the first and second shielding plates, and the second shielding apparatus further comprises a second insulation supporting pole connecting the third and fourth shielding plates.

* * * * *